(12) United States Patent
Huang et al.

(10) Patent No.: US 11,681,314 B2
(45) Date of Patent: Jun. 20, 2023

(54) HOT-SWAP CIRCUIT AND CONTROL APPARATUS

(71) Applicant: APUTURE IMAGING INDUSTRIES CO., LTD., Guangdong (CN)

(72) Inventors: Yi Huang, Guangdong (CN); Xiangjun Zhou, Guangdong (CN); Kun Tong, Guangdong (CN)

(73) Assignee: APUTURE IMAGING INDUSTRIES CO., LTD., Guangdong (CN)

( * ) Notice: Subject to any disclaimer, the term of this patent is extended or adjusted under 35 U.S.C. 154(b) by 0 days.

(21) Appl. No.: 17/646,519

(22) Filed: Dec. 30, 2021

(65) Prior Publication Data

US 2023/0132884 A1    May 4, 2023

(30) Foreign Application Priority Data

Nov. 4, 2021    (CN) .......................... 202111298960.7

(51) Int. Cl.
*H03K 5/08*        (2006.01)
*G05F 1/56*        (2006.01)
(Continued)

(52) U.S. Cl.
CPC .................. *G05F 1/56* (2013.01); *H03K 5/01* (2013.01); *H03K 17/687* (2013.01); *H03K 2005/00013* (2013.01)

(58) Field of Classification Search
CPC .......... G05F 1/56; H03K 5/01; H03K 17/687; H03K 2005/00013
(Continued)

(56) References Cited

U.S. PATENT DOCUMENTS 7,626,792 B2 * 12/2009 Mitsuda ................. H02H 3/087
                                                                 361/93.1
7,995,319 B2 *  8/2011 Kojima ................ H03K 17/145
                                                                 361/93.1
(Continued)

FOREIGN PATENT DOCUMENTS

| CN | 101154809 A | 4/2008 |
| CN | 105322522 A | 2/2016 |
| CN | 112689935 A | 4/2021 |

OTHER PUBLICATIONS

The First Office Action and Search Report dated Dec. 15, 2021, for Aputure Imaging Industries Co., Ltd., from China Application No. 202111298960.7.

*Primary Examiner* — Ryan Jager (57) ABSTRACT

The present disclosure provides a hot-swap circuit and a control apparatus. The hot-swap circuit includes: a power input terminal, a power output terminal; a startup module electrically connected to the power input terminal and the power output terminal; a switch module electrically connected to the power input terminal, the power output terminal, and the startup module; a detection module electrically connected to the startup module, the switch module, and the power output terminal. When a surge signal is input at the power input terminal, a voltage value of a first control signal output by the detection module doesn't fall in a voltage value range of a preset first control signal, then the switch module is controlled to be turned off, so as to cut off a power signal input to the power output terminal, reducing probability of circuit damage, and reducing sparking phenomena of hot-swap power interfaces.

16 Claims, 4 Drawing Sheets

(51) Int. Cl.
*H03K 5/01* (2006.01)
*H03K 17/687* (2006.01)
*H03K 5/00* (2006.01)

(58) Field of Classification Search
USPC .......................................................... 327/323
See application file for complete search history.

(56) References Cited

U.S. PATENT DOCUMENTS

| | | | | |
|---|---|---|---|---|
| 8,148,962 | B2* | 4/2012 | Elran | G05F 1/575 |
| | | | | 323/281 |
| 8,717,727 | B2* | 5/2014 | Nakahara | H02H 7/10 |
| | | | | 361/93.1 |
| 11,371,458 | B2* | 6/2022 | Inaba | F02D 41/3005 |
| 2005/0013079 | A1* | 1/2005 | Mitsuda | H02H 3/087 |
| | | | | 361/100 |
| 2006/0132999 | A1* | 6/2006 | Kimura | H03K 17/166 |
| | | | | 361/93.1 |
| 2022/0161654 | A1* | 5/2022 | Nakagawa | B60K 28/066 |

* cited by examiner

HOT-SWAP CIRCUIT AND CONTROL APPARATUS

CROSS REFERENCE TO RELATED APPLICATION

This application claims priority of Chinese Application No. 202111298960.7 filed on Nov. 4, 2021, title of which is "HOT-SWAP CIRCUIT, CONTROL APPARATUS, AND DEVICE", the entire disclosure of which is incorporated by reference in this application.

FIELD OF INVENTION

The present disclosure relates to a field of power technology, and more particularly, to a hot-swap circuit and a control apparatus.

BACKGROUND OF INVENTION

Existing electrical devices and control boxes, etc. all have input interfaces, such as power input interfaces or electrical connection interfaces of male plugs and female plugs, through which the electrical devices and the control boxes are directly electrically connected to a driver board.

When the devices are hot-swapped through the input interface, due to large capacitance (large capacitance load) on the driver board, a very large surge current, and simultaneously a very high peak voltage, are input to the driver board when power is connected. It is prone to damage circuits, and hot-swap power interfaces (power plugs, power electrical connectors) are prone to spark, resulting in adverse effects such as blackening and rapid aging and reduce overall service life and reliability of a system.

SUMMARY OF INVENTION

Embodiments of the present disclosure provide a hot-swap circuit, a control apparatus, and a device, which can reduce probability of circuit damage caused by surge currents when power is connected, reduce problems of blackening and rapid aging caused by sparking phenomena of hot-swap power interfaces, and improve circuit reliability.

In the first aspect, an embodiment of the present disclosure provides a hot-swap circuit, including:

a power input terminal and a power output terminal;

a startup module electrically connected to the power input terminal and the power output terminal for outputting a constant current signal with a preset current value to charge the power output terminal;

a switch module electrically connected to the power input terminal, the power output terminal, and the startup module for controlling an on or off state of electrical connection between the power input terminal and the power output terminal; and a detection module electrically connected with the startup module, the switch module, and the power output terminal, wherein the detection module is used to output a first control signal according to the constant current signal, and control an on or off state of the switch module according to a voltage value of the first control signal and a voltage value range of a preset first control signal.

In a possible implementation of the present disclosure, the startup module includes a first switch tube, a first voltage divider, a second voltage divider, and a voltage-regulator tube, wherein both a first end of the first switch tube and a first end of the second voltage divider are electrically connected to the power input terminal, a second end of the second voltage divider is electrically connected to a first end of the voltage-regulator tube, a second end of the first switch tube is electrically connected to an electrical connection point where the second end of the second voltage divider is electrically connected to the first end of the voltage-regulator tube, a third end of the first switch tube is electrically connected with a first end of the first voltage divider, and a second end of the first voltage divider is electrically connected to a second end of the voltage-regulator tube.

In a possible implementation of the present disclosure, the switch module includes:

a first switch unit, the first switch unit electrically connected to the power input terminal, the power output terminal, and the startup module for controlling the on or off state of the electrical connection between the power input terminal and the power output terminal;

a first conversion unit, the first conversion unit electrically connected to the first switch unit and the detection module, wherein the first conversion unit is used to receive a first control signal input by the detection module and output a second control signal to the first switch unit according to the first control signal to control an on or off state of the first switch unit.

In a possible implementation of the present disclosure, the first switch unit includes a second switch tube and a plurality of second switch tubes electrically connected in parallel, wherein the second switch tube is an N-channel metal oxide semiconductor field effect transistor.

In a possible implementation of the present disclosure, the startup module includes:

a push-pull unit electrically connected between the first switch unit and the first conversion unit for amplifying the second control signal output by the first conversion unit;

a bias power supply module, the bias power supply module electrically connected to the switch module for supplying power to the first conversion unit and the push-pull unit.

In a possible implementation of the present disclosure, the switch module includes:

a second switch unit, the second switch unit electrically connected to the power input terminal, the power output terminal, and the startup module for controlling the on or off state of the electrical connection between the power input terminal and the power output terminal;

a second conversion unit, the second conversion unit electrically connected to the second switch unit and the detection module, wherein the second conversion unit is used to receive a first control signal input by the detection module and output a third control signal to the second switch unit according to the first control signal to control an on or off state of the second switch unit.

In a possible implementation of the present disclosure, the second switch unit includes a third switch tube and a plurality of third switch tubes electrically connected in parallel, wherein the third switch tube is a P-channel metal oxide semiconductor field effect transistor.

In a possible implementation of the present disclosure, the detection module includes:

a detection unit, which is electrically connected to the startup module and the switch module for outputting the first control signal and a third control signal according to the constant current signal, wherein the first control signal is used for controlling the on or off state of the switch module.

In a possible implementation of the present disclosure, the detection module further includes:

an anti-jitter delay unit electrically connected with the detection unit for detecting a voltage value of the third control signal and controlling an on or off state of the detection unit according to the voltage value of the third control signal and a preset delay start voltage value.

In a possible implementation of the present disclosure, the anti-jitter delay unit includes:

a control unit, wherein the control unit is configured to control the on or off state of the detection unit according to the voltage value of the third control signal and the preset delay start voltage value;

a delay unit, wherein the delay unit is used to control a delay start of the control unit.

In a possible implementation of the present disclosure, both the power input terminal and the power output terminal are electrically connected with a surge protection module, and the surge protection module is used to suppress a surge voltage input to the power input terminal and the power output terminal.

On the other hand, the present disclosure provides a control apparatus, which includes a hot-swap circuit, wherein the hot-swap circuit adopts the aforementioned hot-swap circuit.

On the other hand, the present disclosure provides a device, which includes a hot-swap circuit as described above or a control apparatus as described above.

After the power input terminal of the present disclosure is connected to a power signal input from outside, the startup module outputs the constant current signal with the preset current value to the power output terminal according to the power signal to charge the power output terminal, while the detection module outputs a first control signal according to the constant current signal. When a voltage value of the first control signal falls in voltage value range of a preset first control signal, the detection module controls the switch module to be turned on, otherwise controls the switch module to be turned off. When the switch module is turned on, the input power signal is output through the power output terminal. Therefore, when a surge signal is input at the power input terminal, the voltage value of the first control signal output by the detection module does not fall in the voltage value range of the preset first control signal, and then the switch module is controlled to be turned off, thereby cutting off the power signal input to the power output terminal, reducing probability of circuits damage caused by a surge current, reducing problems of blackening and rapid aging caused by sparking phenomena of hot-swap power interfaces, so as to protect a power supply device.

DESCRIPTION OF DRAWINGS

Accompanying figures to be used in description of embodiments of the present disclosure will be described in brief to more clearly illustrate technical solutions of the embodiments. It is obvious that the accompanying figures described below are only part of the embodiments of the present disclosure, from which figures those skilled in the art can derive further figures without making any inventive efforts.

DETAILED DESCRIPTION OF PREFERRED EMBODIMENTS

Technical solutions in the embodiments of the present disclosure will be clearly and completely described below with reference to the accompanying figures in the embodiments of the present disclosure. It is obvious that the described embodiments are only a part of the embodiments of the present disclosure, and not all of the embodiments. All other embodiments, which can be obtained by those skilled in the art based on the embodiments in the present disclosure without creative work, shall fall within scope of the present disclosure.

In the description of the present disclosure, it should be understood that terms "first", "second" are used for purpose of describing only and are not to be construed as indicating or implying relative importance or implicitly indicating a number of technical features indicated. Thus, features defined as "first", "second", may explicitly or implicitly include one or more of the described features. In the description of the present disclosure, "a plurality of" or "multiple" means two or more unless otherwise specifically defined.

In the present disclosure, a term "exemplary" is used to represent "serving as an example, illustration or description." Any embodiment described as "exemplary" in the present disclosure is not necessarily construed to be more preferable or more advantageous than other embodiments. In order to enable any person skilled in the art to implement and use the present disclosure, the following description is given. In the following description, details are listed for purpose of explanation. It should be understood that those of ordinary skill in the art will realize that the present disclosure can also be implemented without using these specific details. In other embodiments, well-known structures and processes will not be described in detail to avoid unnecessary details to obscure the description of the present disclosure. Therefore, the present disclosure is not intended to be limited to the embodiments shown, but is to be accorded the widest scope consistent with principles and features disclosed in the present disclosure.

The embodiment of the present disclosure provides a hot-swap circuit, a control apparatus, and a device. Detailed descriptions are given below respectively.

Figure 1:
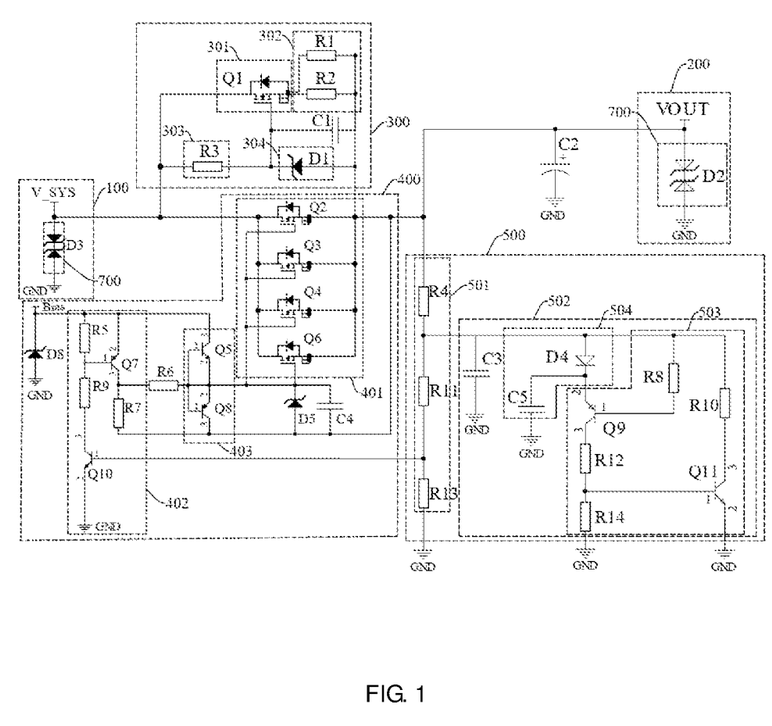
FIG. 1 is a structural schematic diagram of a hot-swap circuit provided by an embodiment of the present disclosure.

FIG. 1 is a structural schematic diagram of a hot-swap circuit provided by an embodiment of the present disclosure. The hot-swap circuit includes:

a power input terminal 100 and a power output terminal 200, wherein the power input terminal 100 is electrically connected to a power supply device for providing power signals, and the power output terminal 200 is electrically connected to input terminal of a corresponding driver board or a driver circuit that needs to be connected to a power supply. The power output terminal 200 includes one or more parallel load capacitors C2, which can also be set in a subsequent circuit (such as the driver board, the driver circuit or other circuits). Power supply of the driver board or the driver circuit is realized through the charge and discharge function of the load capacitor C2.

a startup module 300, which is electrically connected to the power input terminal 100 and the power output terminal 200 for outputting a constant current signal with a preset current value to charge the power output terminal 200. Specifically, after the power output terminal 200 is connected to the power supply, the startup module 300 outputs the constant current signal with the preset current value to charge the load capacitor C2;

a switch module 400, which is electrically connected to the power input terminal 100, the power output terminal 200, and the startup module 300, for controlling on or off state of electrical connection between the power input terminal 100 and the power output terminal 200;

a detection module 500, which is electrically connected with the startup module 300, the switch module 400, and the power output terminal 200, wherein the detection module 500 is used to output first control signal according to the constant current signal, and control on or off state of the switch module 400 according to a voltage value of the first control signal and a voltage value range of a preset first control signal.

After the power input terminal 100 of the present disclosure is connected to a power signal input from outside, the startup module 300 outputs the constant current signal with the preset current value to the power output terminal 200 according to the power signal to charge the power output terminal 200, while the detection module 500 outputs the first control signal according to the constant current signal. When a voltage value of the first control signal falls in the voltage value range of the preset first control signal, the detection module 500 controls the switch module 400 to be turned on, otherwise controls the switch module 400 to be turned off. When the switch module 400 is turned on, the input power signal is output through the power output terminal 200. Therefore, when a surge signal is input at the power input terminal 100, the voltage value of the first control signal output by the detection module 500 does not fall in the voltage value range of the preset first control signal, and then controls the switch module 400 to be turned off, thereby cutting off the power signal input to the power output terminal 200, reducing probability of circuit damage caused by a surge current, reducing problems of blackening and rapid aging caused by sparking phenomena of hot-swap power interfaces, so as to protect the power supply device.

In a possible implementation of the present disclosure, a power input terminal 100 and a power output terminal 200 are each electrically connected with a surge protection module 700, and the surge protection module 700 is used to suppress a surge voltage input to the power input terminal 100 and the power output terminal 200.

As shown in FIG. 1, the surge protection module 700 includes a transient voltage suppressor (TVS) D2 and a transient voltage suppressor D3, wherein one end of the transient voltage suppressor D3 is electrically connected to the power input terminal 100, and another end of the transient voltage suppressor D3 is grounded, while one end of the voltage suppressor D2 is electrically connected to the power output terminal 200, and another end of the transient voltage suppressor D2 is grounded. When two ends of the transient voltage suppressor undergo an instantaneous high-energy impact, it can suddenly reduce its impedance at a very high speed, and at a same time absorb a large current, so as to clamp a voltage between its two ends to a predetermined value, so that it can be used to suppress the surge voltage input to the power input terminal 100 and the power output terminal 200 to ensure that the components in the hot-swap circuit are not damaged by the impact of the surge voltage.

In a possible implementation of the present disclosure, a startup module 300 includes a first switch tube 301, a first voltage divider 302, a second voltage divider 303, and a voltage-regulator tube 304, wherein both a first end of the first switch tube 301 and a first end of the second voltage divider 303 are electrically connected to a power input terminal 100, a second end of the second voltage divider 303 is electrically connected to a first end of the voltage-regulator tube 304, a second end of the first switch tube 301 is electrically connected to an electrical connection point where the second end of the second voltage divider 303 is electrically connected to the first end of the voltage-regulator tube 304, a third end of the first switch tube 301 is electrically connected with a first end of the first voltage divider 302, and a second end of the first voltage divider 302 is electrically connected to a second end of the voltage-regulator tube 304.

Specifically, the first switch tube 301 includes a first switch tube Q1, which may be an N-channel metal oxide semiconductor field effect transistor, that is, an N-channel MOS field effect transistor, or a P-channel MOS field effect transistor. A resistor R1 as the first voltage divider 302 may also be a resistor R1 and a resistor R2 connected in parallel, or more resistors in parallel may be set according to specific needs, which is not specifically limited here. The second voltage divider 303 is a voltage dividing resistor R3, and the voltage-regulator tube 304 is a voltage-regulator tube D1. As shown in FIG. 1, both a drain of the first switch tube Q1 and one end of the divider resistor R3 are electrically connected to the power input terminal 100, another end of the voltage dividing resistor R3 is electrically connected to one end of the voltage-regulator tube D1, a source of the first switch tube Q1 is electrically connected to one end of the resistor R2, the resistor R1 and the resistor R2 are connected in parallel with each other, another end of the resistor R2 and another end of the voltage-regulator tube D1 are electrically connected to the power output terminal 200, and a gate of the first switch tube Q1 is electrically connected to an electrical connection point of the divider resistor R3 and the voltage-regulator tube D1.

In an application process, during a charging process, a fixed voltage point is formed between the divider resistor R3 and the voltage-regulator tube D1, so that a voltage value across both ends of the voltage-regulator tube D1 is constant, that is, a voltage value across both ends of the resistor R1 and resistor R2 connected in parallel and the first switch tube Q1 is same as a voltage value across both ends of the voltage-regulator tube D1. Since a voltage value across common both ends of the resistor R1 and the resistor R2 is constant, a current in the resistor R1 and a current in the resistor R2 are also constant, thus forming a constant current circuit. After receiving a power signal input from the power input terminal 100, a startup module 300 outputs the constant current signal with the preset current value to a power output terminal 200 to realize constant current startup.

In this embodiment, the startup module 300 further includes a decoupling capacitor C1, wherein the voltage-regulator tube D1 is electrically connected in parallel with the decoupling capacitor C1. As shown in FIG. 1, both one end of the decoupling capacitor C1 and the gate of the first switch tube Q1 are electrically connected to the electrical connection point of the divider resistor R3 and the voltage-regulator tube D1, and another end of the decoupling capacitor C1 is electrically connected to another end of the voltage-regulator tube D1. The decoupling capacitor C1 prevents oscillation of first switch tube Q1 and enhances stability of the startup module 300.

In this embodiment, the preset current value of the constant current signal output by the startup module 300 can be adjusted according to specific actual situations. Here, the preset current value of the constant current signal is not specifically limited. Exemplary, the preset current value of the constant current signal can be adjusted by setting parallel resistance value parameters of resistor R1 and resistor R2 or by selecting the voltage-regulator tube D1 with different voltage regulation parameters, e.g., increasing or decreasing the resistance values of resistor R1 and resistor R2, selecting a diode D1 with a larger and smaller voltage regulated value.

In an embodiment of the present disclosure, a switch module 400 is connected in parallel with a startup module 300. Specifically, the switch module 400 includes:

a first switch unit 401, the first switch unit 401 electrically connected to a power input terminal 100, a power output terminal 200, and a startup module 300, for controlling on or off state of electrical connection between the power input terminal 100 and the power output terminal 200;

a first conversion unit 402, the first conversion unit 402 electrically connected to the first switch unit 401 and a detection module 500, wherein the first conversion unit 402 is used to receive a first control signal input by the detection module 500 and output a second control signal to the first switch unit 401 according to the first control signal to control on or off state of the first switch unit 401.

In an embodiment of the present disclosure, a first switch unit 401 includes a second switch tube or a plurality of second switch tubes electrically connected in parallel. As shown in FIG. 1, the first switch unit 401 may include a second switch tube Q2. In order to distribute the heating power to the second switch tube Q2, it may also include a plurality of second switch tubes electrically connected in parallel, that is, a second switch tube Q3, a second switch tube Q4, and a second switch tube Q6.

The second switch tube includes an N-channel metal oxide semiconductor field effect transistor or a P-channel metal oxide semiconductor field effect transistor. Exemplary, the second switch tube Q2, the second switch tube Q3, the second switch tube Q4, and the second switch tube Q6 may be all N-channel metal oxide semiconductor field effect transistors or all P-channel metal oxide semiconductor field effect transistors, which are not limited here.

In this embodiment, as shown in FIG. 1, the second switch tube Q2, the second switch tube Q3, the second switch tube Q4, and the second switch tube Q6 are all N-channel metal oxide semiconductor field effect transistors, wherein a drain of the second switch tube Q2, a drain of the second switch tube Q3, a drain of the second switch tube Q4, and a drain of the second switch tube Q6 are electrically connected in parallel and electrically connected to a power input terminal 100, and connected in parallel at a connection point between the startup module 300 and the power input terminal 100, a source of the second switch tube Q2, a source of the second switch tube Q3, a source of the second switch tube Q4, and a source of the second switch tube Q6 are commonly connected in parallel, and then electrically connected to a power output terminal 200, and connected in parallel at a connection point between the startup module 300 and the power output terminal 200. A gate of the second switch tube Q2, a gate of the second switch tube Q3, a gate of the second switch tube Q4, and a gate of the second switch tube Q6 are electrically connected in parallel and then electrically connected to a first conversion unit 402.

On or off state of the power input terminal 100 and the power output terminal 200 is controlled by the second switch tube Q2, the second switch tube Q3, the second switch tube Q4, and the second switch tube Q6, so that when a surge voltage is input to the power input terminal 100, the second switch tube Q2, the second switch tube Q3, the second switch tube Q4, and the second switch tube Q6 can be used to control disconnection between the power input terminal 100 and the power output terminal 200 and suppress the surge voltage from being output to the power output terminal 200, thereby protecting other components electrically connected to the power output terminal 200.

When the second switch tube is an N-channel metal oxide semiconductor field effect transistor, correspondingly, as shown in FIG. 1, the first conversion unit 402 includes a resistor R5, a resistor R7, a resistor R9, a transistor Q7 and a transistor Q10, wherein the transistor Q7 can be a PNP type transistor or a P-channel MOS field effect transistor, and the transistor Q10 can be an NPN type transistor or an N-channel MOS field effect transistor, which is not limited here.

In this embodiment, the transistor Q7 is a PNP type transistor, the transistor Q10 is an NPN type transistor. One end of the resistor R5 is electrically connected with one end of the resistor R9, another end of the resistor R9 is electrically connected with a collector of the transistor Q10, an emitter of the transistor Q10 is grounded, and a base of the transistor Q10 is electrically connected with an output end of the detection module 500. Another end of the resistor R5 is electrically connected to an emitter of the transistor Q7, a base of the transistor Q7 is electrically connected to an electrical connection point between the resistor R5 and the resistor R9, a collector of the transistor Q7 is electrically connected to one end of the resistor R7, and another end of the resistor R7 is electrically connected to the first switch unit 401.

A first control signal input by the detection module 500 is received through the base of the transistor Q10, then the first control signal controls the transistor Q10 to be turned on. After the transistor Q10 is turned on, a collector voltage of the transistor Q10 is pulled down. Due to voltage division function of the resistor R5 and the resistor R9, the transistor Q7 is turned on, and then outputs a second control signal to the first switch unit 401, thereby controlling conduction of the first switch unit 401. When the base of the transistor Q10 receives the first control signal input by the detection module 500 and the first control signal does not meet a conduction condition of the transistor Q10, correspondingly, both the transistor Q7 and the first switch unit 401 are turned off.

In order to enhance a driver signal of the first switch unit 401, a push-pull unit 403 can be added to the switch module 400. The on or off state of the first switch unit 401 can be controlled by the push-pull unit 403, and the push-pull unit 403 can simultaneously accelerate turn-on speed or turn-off speed of each second switch tube in the first switch unit 401.

Therefore, in an embodiment of the present disclosure, when the second switch tube is an N-channel metal oxide semiconductor field effect transistor, a switch module 400 includes:

a push-pull unit 403, electrically connected between a first switch unit 401 and a first conversion unit 402, and the push-pull unit 403 is used to amplify a second control signal output by the first conversion unit 402.

Specifically, the push-pull unit 403 includes a transistor Q5, a transistor Q8, and a current-limiting resistor R6. In the present disclosure, the transistor Q5 is a PNP type transistor and the transistor Q8 is an NPN type transistor. In this embodiment, the push-pull unit 403 may also be other types of switch tubes that can function as switches, such as MOS field effect transistors or field effect transistors, which are not specifically limited here.

As shown in FIG. 1, the transistor Q5 and the transistor Q8 are electrically connected back-to-back with each other, that is, a base of the transistor Q5 and a base of the transistor Q8 are electrically connected, an electrical connection point of the base of the transistor Q5 and the base of the transistor Q8 is connected to a common parallel electrical connection point of a gate of a second switch tube Q2, a gate of a second switch tube Q3, a gate of a second switch tube Q4, and a gate of a second switch tube Q6, an emitter of the transistor Q5 and an emitter of the transistor Q8 is electrically connected, a collector of the transistor Q5 is electrically connected with an emitter of the transistor Q7, and a collector of the transistor Q8 is electrically connected with a free end of resistor R7.

One end of the current-limiting resistor R6 is electrically connected to the electrical connection point of the base of the transistor Q5 and the base of the transistor Q8, and another end of the current-limiting resistor R6 is electrically connected to an electrical connection point of the collector of the transistor Q7 and the resistor R7.

The push-pull unit 403 is composed of the transistor Q5 and the transistor Q8 to amplify the second control signal output by the first conversion unit 402, which can accelerate the turn-on or turn-off speed of the switch unit.

In an embodiment of the present disclosure, when a second switch tube is an N-channel metal oxide semiconductor field effect transistor, according to characteristics of the N-channel metal oxide semiconductor field effect transistor, a push-pull unit 403 needs to output a high level to turn on a second switch tube Q2, a second switch tube Q3, a second switch tube Q4, and a second switch tube Q6 in a first switch unit 401. Due to poor stability of a power supply voltage input from a power input terminal 100, it cannot satisfy stable power supply of the push-pull unit 403 and first conversion unit 402, thus leading to unstable operation of the second switch tube Q2, the second switch tube Q3, the second switch tube Q4, and the second switch tube Q6 in the first switch unit 401. Therefore, when the second switch tube Q2, the second switch tube Q3, the second switch tube Q4, and the second switch tube Q6 in the first switch unit 401 may all be N-channel metal oxide semiconductor field effect transistors, it is necessary to add a bias power supply module 600, through which to supply power to the first conversion unit 402 and the push-pull unit 403.

Therefore, the hot-swap circuit in the present disclosure further includes the bias power supply module 600, and the bias power supply module 600 is electrically connected to a switch module 400 and is used to supply power to the first conversion unit 402 and the push-pull unit 403.

Figure 2:
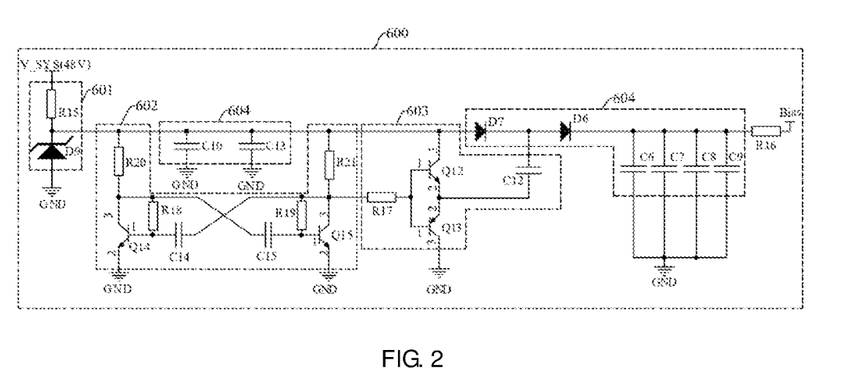
FIG. 2 is a structural schematic diagram of a bias power supply module provided by an embodiment of the present disclosure.

As shown in FIG. 2, a bias power supply module 600 includes a current-limiting protection unit 601, an anti-surge slow-start protection unit 602, a second push-pull unit 603, and a rectification filter unit 604 that are electrically connected in sequence.

Specifically, the current-limiting protection unit 601 includes a resistor R15 and a TVS tube D9, wherein one end of the resistor R15 is electrically connected to a power output port of a power supply device, and another end of the resistor R15 is grounded through the TVS tube D9. Current of power supply input by the power supply device is limited through the resistor R15, and an instantaneous high voltage inputted is suppressed through the TVS tube D9, so as to protect components in the bias power supply module 600.

The bias power supply module 600 further includes a current-limiting resistor R16, and two ends of the current-limiting resistor R16 are electrically connected to output terminals of the rectification filter unit 604 and the bias power supply module 600, respectively.

The anti-surge slow-start protection unit 602 includes a resistor R20, a resistor R18, a resistor R19, a resistor R21, a capacitor C14, a capacitor C15, a transistor Q14, and a transistor Q15.

A collector of the transistor Q14 is electrically connected to an electrical connection point of the resistor R15 and the TVS tube D9 through the resistor R20, an emitter of the transistor Q14 is grounded, a base of the transistor Q14 is electrically connected to a collector of the transistor Q15 through the capacitor C14, and two ends of the resistor R18 are respectively electrically connected between a collector and the base of the transistor Q14.

The collector of the transistor Q15 is electrically connected to the electrical connection point of the resistor R15 and the TVS tube D9 through the resistor R21, an emitter of the transistor Q15 is grounded, and a base of the transistor Q15 is electrically connected to the collector of the transistor Q14 through the capacitor C15, and two ends of the resistor R19 are respectively electrically connected between the collector and the base of the transistor Q15.

In this embodiment, after the bias power supply module 600 is connected to a power supply, a certain voltage value exists across both ends of the resistor R20 and the resistor R21. The capacitor C15 is charged through the resistor R20, and the capacitor C14 is charged through the resistor R21. When a power supply voltage connected to the bias power supply module 600 falls, the capacitor C14 and the capacitor C15 begin to discharge. When the capacitor C14 and the capacitor C15 are discharged for a period of time, making a voltage across two ends of the resistor R18 reaches a turn-on voltage of the transistor Q14 and a voltage across two ends of the resistor R19 reaches a turn-on voltage of the transistor Q15, both the transistor Q14 and the transistor Q15 are turned on, so as to guide voltages in the capacitor C14 and in the capacitor C15 to be pulled down to ground, protecting components at back end of the bias power supply module 600. If the bias power supply module 600 has an instantaneous high-voltage surge voltage after being connected to the power supply, the surge voltage is quickly input to ground to protect a back-end circuit by above-mentioned way.

The second push-pull unit 603 includes a transistor Q13, a transistor Q12, a current-limiting resistor R17, and a capacitor C12. The transistor Q13 and the transistor Q12 are electrically connected back-to-back with each other, wherein a base of the transistor Q13 is electrically connected to a base of the transistor Q12, an emitter of transistor Q13 is electrically connected to an emitter of the transistor Q12, and a collector of the transistor Q13 is electrically connected to an emitter of a transistor Q7. One end of the current-limiting resistor R17 is electrically connected to an electrical connection point of the base of the transistor Q13 and the base of the transistor Q12, and another end of the current-limiting resistor R17 is electrically connected to an electrical connection point of the resistor R21 and the collector of the transistor Q15. One end of the capacitor C12 is electrically connected to an electrical connection point of the emitter of the transistor Q13 and the emitter of the transistor Q12. Another end of the capacitor C12 is electrically connected to a cathode of a diode D7 (see below). Through complementary push-pull amplification of the transistor Q13 and the transistor Q12, the capacitor C12 acts as auxiliary push-pull amplification, enhancing output power of the bias power supply module 600, and improving instantaneous response speed of an output current and voltage output characteristics. In this embodiment, the second push-pull unit 603 may also be other type of switch tubes that can function as switches, which is not specifically limited here.

The rectification filter unit 604 includes the diode D7, a diode D6, a capacitor C13, a capacitor C10, a capacitor C6, a capacitor C7, a capacitor C8, and a capacitor C9. As shown in FIG. 2, one end of the capacitor C13 and one end of the capacitor C10 are both electrically connected to an electrical connection point of the resistor R15 and the TVS tube D9, another end of the capacitor C13 and another end of the capacitor C10 are both grounded, the diode D7 and the diode D6 are connected in series, an anode of diode D7 is electrically connected to the collector of transistor Q12, the cathode of diode D7 is electrically connected to an anode of diode D6. One end of capacitor C12 is electrically connected to an electrical connection point between the cathode of the diode D7 and the anode of the diode D6. One common end of the capacitor C6, the capacitor C7, the capacitor C8, and the capacitor C9 connected in parallel is electrically connected to a cathode of the diode D6, and another common end of the capacitor C6, the capacitor C7, the capacitor C8, and the capacitor C9 connected in parallel is grounded.

In an embodiment of the present disclosure, a second switch tube can also be a P-channel metal oxide semiconductor field effect transistor, when the second switch tube is a P-channel metal oxide semiconductor field effect transistor, according to characteristic of a P-channel MOS field effect transistor, it is not necessary for a push-pull unit 403 to output a high level to ensure that a second switch unit 404 is turned on. Therefore, correspondingly, differences between the second switch tubes being both P-channel MOS field effect transistors and the second switch tubes being both N-channel MOS field effect transistors are that, a switch module 400 does not include the push-pull unit 403 and a bias power supply circuit for supplying power to the push-pull unit 403 and a first conversion unit 402.

Figure 3:
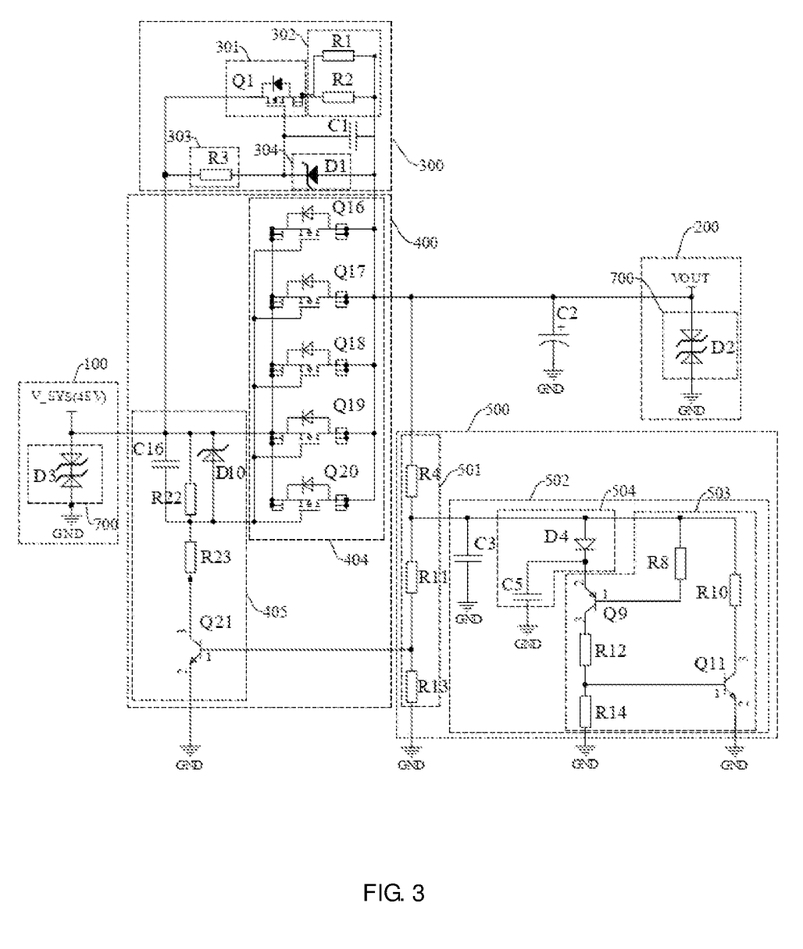
FIG. 3 is a structural schematic diagram of a hot-swap circuit provided by an embodiment of the present disclosure.

Therefore, in this embodiment, a second type of a switch module 400 is proposed that can be applied to hot-swap circuits, and the switch module 400 includes:

a second switch unit 404, the second switch unit 404 electrically connected to a power input terminal 100, a power output terminal 200, and a startup module 300, wherein the second switch unit 404 is used to control electrical connection between the power input terminal 100 and the power output terminal 200;

a second conversion unit 405, the second conversion unit 405 electrically connected to the second switch unit 404 and a detection module 500, wherein the second conversion unit 405 is used to receive the first control signal input by the detection module 500 and output the third control signal to the second switch unit 404 according to the first control signal to control on or off state of the second switch unit 404.

In this embodiment, the second switch unit 404 includes a third switch tube or a plurality of third switch tubes electrically connected in parallel, wherein the third switch tubes are P-channel metal oxide semiconductor field effect transistors, as shown in FIG. 3, that is, a third switch tube Q16, a third switch tube Q17, a third switch tube Q18, a third switch tube Q19, and a third switch tube Q20 in the second switch unit 404 are all P-channel MOS field effect transistors.

A source of the third switch tube Q16, a source of the third switch tube Q17, a source of the third switch tube Q18, a source of the third switch tube Q19 and a source of the third switch tube Q20 are commonly electrically connected in parallel, are electrically connected to the power input terminal 100, and are connected in parallel to a connection point of the startup module 300 and the power input terminal 100. A drain of the third switch tube Q16, a drain of the third switch tube Q17, a drain of the third switch tube Q18, a drain of the third switch tube Q19 and a drain of the third switch tube Q20 are connected in parallel, are electrically connected to the power output terminal 200, and are connected in parallel to a connection point of the startup module 300 and the power output terminal 200. A gate of the third switch tube Q16, a gate of the third switch tube Q17, a gate of the third switch tube Q18, a gate of the third switch tube Q19, and a gate of the third switch tube Q20 are commonly connected in parallel and then electrically connected to the second conversion unit 405. On or off state of connection between the power input terminal 100 and the power output terminal 200 can be controlled by the third switch tube Q16, the third switch tube Q17, the third switch tube Q18, the third switch tube Q19, and the third switch tube Q20, so as to suppress an instantaneous high voltage from outputting to the power output terminal 200 when an instantaneous high voltage is input by the power input terminal 100.

In this embodiment, as shown in FIG. 3, the second conversion unit 405 specifically includes a transistor Q21, a resistor R22, a resistor R23, a voltage-regulator tube D10 and a capacitor C16. A collector of the transistor Q21 is electrically connected to the power input terminal 100 through the resistor R22 and the resistor R23, an emitter of the transistor Q21 is grounded, a base of the transistor Q21 is electrically connected to an output terminal of a detection module 500, the gate of the third switch Q16, the gate of the third switch tube Q17, the gate of the third switch tube Q18, the gate of the third switch tube Q19, and the gate of the third switch tube Q20 in the second switch unit 404 are commonly connected in parallel and then electrically connected to an electrical connection point of collector of the transistor Q21 and the resistor R23. One end of the capacitor C16 is electrically connected to the power input terminal 100, another end of the capacitor C16 is electrically connected to an electrical connection point of the collector of the tirode Q21 and the resistor R23, a cathode of the voltage-regulator tube D10 is electrically connected to the power input terminal 100, and an anode of the voltage-regulator tube D10 is electrically connected to an electrical connection point of the collector of the transistor Q21 and the resistor R23.

A first control signal input by the detection module 500 is received through the base of the transistor Q21, then the first control signal controls the transistor Q21 to be turned on. After the transistor Q21 is turned on, the collector voltage of the transistor Q21 is pulled down. Due to voltage division function of the resistor R22 and the resistor R22, the gate of the third switch tube Q16, the gate of the third switch tube Q17, the gate of the third switch tube Q18, and the gate of the third switch tube Q19 generate a third control signal to control the second switch unit 404 to be turned on. When the base of the transistor Q21 receives the first control signal input by the detection module 500, and the first control signal does not meet turn-on condition of the transistor Q21, correspondingly, the second switch unit 404 is also turned off.

In an embodiment of the present disclosure, a detection module 500 includes:

a detection unit 501, electrically connected to a startup module 300 and a switch module 400, wherein the detection unit 501 is used to output a first control signal and a third control signal according to a constant current signal. The first control signal is used to control the on or off state of a switch module 400. Specifically, as shown in FIG. 1 and FIG. 3, the detection unit 501 includes a voltage dividing resistor R4, a voltage dividing resistor R11, and a voltage dividing resistor R13 that are electrically connected in sequence. Another end of the voltage dividing resistor R4 is electrically connected to an electrical connection point of a startup module 300 and an output terminal 200, a base of a transistor Q10 (or a transistor Q21) is electrically connected to an electrical connection point of the voltage dividing resistor R11 and the voltage dividing resistor R13. A constant current signal output by the startup module 300 is detected at the electrical connection point of the voltage dividing resistor R4, the startup module 300 and the power output terminal 200. A voltage is divided between the voltage dividing resistor R11 and the voltage dividing resistor R13 to form a first control signal, and a voltage is divided between the voltage dividing resistor R4 and the voltage dividing resistor R11 to form a third control signal. The first control signal controls on or off state of the transistor Q10, so as to control on or off state of the switch module 400. In this embodiment, a voltage value range of a preset first control signal in the detection module 500 is a turn-on voltage of the transistor Q10. When a voltage value of the first control signal reaches the turn-on voltage of the transistor Q10, the transistor Q10 is turned on.

In an application process, when the startup module 300 receives a power signal input from a power input terminal 100, the startup module 300 outputs a constant current signal with a preset current value. When the power output terminal 200 is charged, a certain value of voltage is applied across two ends of the voltage dividing resistor R4, across two ends of the voltage dividing resistor R11, and across two ends of the voltage dividing resistor R13. When a voltage of an electrical connection point of the voltage dividing resistor R11 and the voltage dividing resistor R13 meets turn-on condition of the transistor Q10 (or the transistor Q21), the transistor Q10 (or the transistor Q21) is turned on, the switch module 400 is turned on, and the power output terminal 200 receives power signals; on the contrary, when a power signal input by the input terminal is a surge voltage or the power output terminal 200 is short-circuited, resulting in a voltage of a electrical connection node of the voltage dividing resistor R11 and the voltage dividing resistor R13 cannot meet the turn-on condition of the transistor Q10 (or the transistor Q21), correspondingly, the transistor Q10 (or the transistor Q21) is turned off, and the power output terminal 200 cannot receive power signals.

In an embodiment of the present disclosure, when a power output terminal 200 is short-circuited and recovers again, or a power input terminal 100 exhibits voltage jitter. For example, the power input terminal 100 maybe poor contacted or plug-in, causing the switch module 400 to be turned on or off too frequently, resulting in large surges in a hot-swap circuit, which is prone to damage the components in the hot-swap circuit. In order to solve a problem of above-mentioned voltage jitter, an anti-jitter delay unit 502 is proposed in this embodiment. That is, the detection module 500 further includes:

an anti-jitter delay unit 502, electrically connected to a detection unit 501, wherein the anti-jitter delay unit 502 is used to detect a voltage value of a third control signal, and control on or off state of the detection unit 501 according to the voltage value of the third control signal and a preset delay start voltage value.

In an embodiment of the present disclosure, the anti-jitter delay unit 502 includes:

a control unit 503, the control unit 503 is configured to control the on or off state of a detection unit 501 according to a voltage value of a third control signal and a preset delay start voltage value;

a delay unit 504, the delay unit 504 is used to control the control delay start of the detection unit 501.

Specifically, the delay unit 504 includes a capacitor C5 and a diode D4. The control unit 503 includes a capacitor C3, a resistor R10, a resistor R8, a resistor R12, a resistor R14, a transistor Q9, and a transistor Q11, wherein the transistor Q9 is a PNP type transistor, and the transistor Q11 is a NPN type transistor.

As shown in FIG. 1 and FIG. 3, one end of the capacitor C3 is electrically connected to an electrical connection point of a resistor R4 and a resistor R11, another end of the capacitor C3 is grounded. An anode of the diode D4 is electrically connected to the capacitor C3, and a cathode of the diode D4 is connected to an emitter of the transistor Q9. One end of the capacitor C5 is electrically connected to an electrical connection point of the cathode of the diode D4 and the emitter of the transistor Q9, and another end of the capacitor C5 is grounded. A collector of the transistor Q9 is electrically connected to one end of the resistor R12, a base of the transistor Q9 is electrically connected to the anode of the diode D4 through the resistor R8, and another end of the resistor R12 is grounded through the resistor R14. A base of the transistor Q11 is electrically connected to an electrical connection point of the resistor R12 and the resistor R14, a collector of the transistor Q11 is electrically connected to the anode of the diode D4 through the resistor R10, and an emitter of the transistor Q11 is grounded.

In this embodiment, the third control signal is a voltage dividing signal formed between the voltage dividing resistor R4 and the voltage dividing resistor R11, and the preset delay start voltage value is a voltage value of the turn-on voltage of the transistor Q9.

In an application process, when there is no voltage jitter, during a charging process of the power output terminal 200, the capacitor C5 is charged through the voltage divider resistor R4 and the diode D4, so that a first control signal formed by dividing voltages among the voltage dividing resistor R4, voltage dividing resistor R11 and voltage dividing resistor R13 meets a turn-on voltage of the transistor Q10 (or transistor Q21), and when the capacitor C5 is charged to meet the turn-on voltage of the transistor Q10 (or transistor Q21), correspondingly, the switch module 400 is maintained to be turned on.

When a circuit jitters, that is, when a voltage at the power output terminal 200 drops, a voltage dividing value forming the third control signal formed between the voltage dividing resistor R4 and the voltage dividing resistor R11 also drops correspondingly in proportion, and at a same time a voltage at the base of the transistor Q9 also drops synchronously. But at this time a voltage of the capacitor C5 in the delay unit 504 remains unchanged, and the diode D4 blocks a current of the emitter of the transistor Q9 from returning, so the transistor Q9 is in turn-off state. When a base voltage of the transistor Q9 drops to a preset startup voltage value, that is, when the base voltage of the transistor Q9 drops to a turn-on voltage of the transistor Q9, the transistor Q9 is turned on at this time. And due to voltage division between the resistor R12 and the resistor R14, the transistor Q11 is turned on, pulling down a voltage divider point of the resistor R4 to ground. Thus, a whole detection module 500 is controlled to be locked, so that the detection unit 501 is turned off. After a period of delay, when the capacitor C5 in the delay unit is discharged to a delay start voltage value, which does not meet the turn-on voltage of the transistor Q9, the transistor Q9 is turned off, and at a same time, the transistor Q11 is made to be turned off, that is, lock is released. Therefore, when voltage jitter occurs in the circuit, the detection module 500 and the switch module 400 are controlled to be turned off to avoid an instantaneous high voltage damaging the entire circuit, so as to better protect driver boards or peripherals connected to the power output terminal 200, and make the circuit safer.

In an embodiment of the present disclosure, the present disclosure provides a control apparatus, which includes a hot-swap circuit, wherein the hot-swap circuit is an aforementioned hot-swap circuit.

In an embodiment of the present disclosure, the present disclosure provides a device, which includes a hot-swap circuit as described above or a control apparatus as described above.

Figure 4:
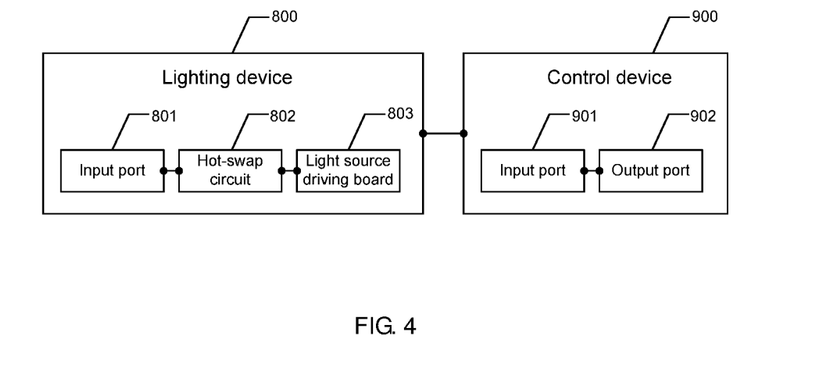
FIG. 4 is a structural schematic diagram of a device provided by an embodiment of the present disclosure.

In this embodiment, as shown in FIG. 4, the device may be a lighting device 800, which has an input port 801. The input port 801 is used to electrically connect to a control device 900, through which to control or drive or supply power to the lighting device 800. Above-mentioned hot-swap circuits 802 can be arranged in the lighting device 800 and located between the input port 801 and a light source driving board 803.

In this embodiment, the device may also be a control device 900, which has an input port 901 and an output port 902, wherein the input port 901 is used to receive external power input, and the output port 902 is used to electrically connect to the lighting device 800 to control or drive or supply power to the lighting device 800 through the control device 900. Above-mentioned hot-swap circuits can be arranged in the input port 901 of the control device 900.

The hot-swap circuit, the control device and the device provided by the embodiments of the present disclosure are described in detail above. Specific examples are used in this document to illustrate the principles and embodiments of the present disclosure. The description of the above embodiments is only used to help understand the method and the core idea of the present disclosure; at the same time, those skilled in the art can obtain, according to the idea of the present disclosure, variations in the specific embodiments and the scope of application, and thus, the content of the present specification should not be construed as limitation to the present disclosure.

What is claimed is:

1. A hot-swap circuit, including:
   a power input terminal and a power output terminal;
   a startup module electrically connected to the power input terminal and the power output terminal for outputting a constant current signal with a preset current value to charge the power output terminal;
   a switch module electrically connected to the power input terminal, the power output terminal, and the startup module for controlling an on or off state of electrical connection between the power input terminal and the power output terminal; and
   a detection module electrically connected with the startup module, the switch module, and the power output terminal, wherein the detection module is used to output a first control signal according to the constant current signal, and control an on or off state of the switch module according to a voltage value of the first control signal and a voltage value range of a preset first control signal;
   wherein the detection module includes:
   a detection unit, which is electrically connected to the startup module and the switch module for outputting the first control signal and a third control signal according to the constant current signal, wherein the first control signal is used for controlling the on or off state of the switch module; and
   an anti-jitter delay unit electrically connected with the detection unit for detecting a voltage value of the third control signal and controlling an on or off state of the detection unit according to the voltage value of the third control signal and a preset delay start voltage value.

2. The hot-swap circuit according to claim 1, wherein the startup module includes a first switch tube, a first voltage divider, a second voltage divider, and a voltage-regulator tube, wherein both a first end of the first switch tube and a first end of the second voltage divider are electrically connected to the power input terminal, a second end of the second voltage divider is electrically connected to a first end of the voltage-regulator tube, a second end of the first switch tube is electrically connected to an electrical connection point where the second end of the second voltage divider is electrically connected to the first end of the voltage-regulator tube, a third end of the first switch tube is electrically connected with a first end of the first voltage divider, and a second end of the first voltage divider is electrically connected to a second end of the voltage-regulator tube.

3. The hot-swap circuit according to claim 1, wherein the switch module includes:
   a first switch unit, the first switch unit electrically connected to the power input terminal, the power output terminal, and the startup module for controlling the on or off state of the electrical connection between the power input terminal and the power output terminal;
   a first conversion unit, the first conversion unit electrically connected to the first switch unit and the detection module, wherein the first conversion unit is used to receive the first control signal input by the detection module and output a second control signal to the first switch unit according to the first control signal to control an on or off state of the first switch unit.

4. The hot-swap circuit according to claim 3, wherein the first switch unit includes a second switch tube and a plurality of second switch tubes electrically connected in parallel, wherein the second switch tube is an N-channel metal oxide semiconductor field effect transistor.

5. The hot-swap circuit according to claim 3, wherein the switch module includes:
   a push-pull unit electrically connected between the first switch unit and the first conversion unit for amplifying the second control signal output by the first conversion unit;
   a bias power supply module, the bias power supply module electrically connected to the switch module for supplying power to the first conversion unit and the push-pull unit.

6. The hot-swap circuit according to claim 1, wherein the switch module includes:
   a second switch unit, the second switch unit electrically connected to the power input terminal, the power output terminal, and the startup module for controlling the on or off state of the electrical connection between the power input terminal and the power output terminal;
   a second conversion unit, the second conversion unit electrically connected to the second switch unit and the detection module, wherein the second conversion unit is used to receive a first control signal input by the detection module and output a third control signal to the second switch unit according to the first control signal to control an on or off state of the second switch unit.

7. The hot-swap circuit according to claim 6, wherein the second switch unit includes a third switch tube and a plurality of third switch tubes electrically connected in parallel, wherein the third switch tube is a P-channel metal oxide semiconductor field effect transistor.

8. The hot-swap circuit according to claim 1, wherein the anti-jitter delay unit includes:
   a control unit, wherein the control unit is configured to control the on or off state of the detection unit according to the voltage value of the third control signal and the preset delay start voltage value; and
   a delay unit, wherein the delay unit is used to control a delay start of the control unit.

9. The hot-swap circuit according to claim 1, wherein both the power input terminal and the power output terminal are electrically connected with a surge protection module, and the surge protection module is used to suppress a surge voltage input to the power input terminal and the power output terminal.

10. A control apparatus, including a hot-swap circuit, wherein the hot-swap circuit includes:
   a power input terminal and a power output terminal;
   a startup module electrically connected to the power input terminal and the power output terminal for outputting a constant current signal with a preset current value to charge the power output terminal;
   a switch module electrically connected to the power input terminal, the power output terminal, and the startup module for controlling an on or off state of electrical connection between the power input terminal and the power output terminal; and
   a detection module, which is electrically connected with the startup module, the switch module, and the power output terminal, wherein the detection module is used to output a first control signal according to the constant current signal, and control an on or off state of the switch module according to a voltage value of the first control signal and a voltage value range of preset first control signal;
   wherein the detection module includes:
   a detection unit, which is electrically connected to the startup module and the switch module for outputting the first control signal and a third control signal according to the constant current signal, wherein the first control signal is used for controlling the on or off state of the switch module; and
   an anti-jitter delay unit electrically connected with the detection unit for detecting a voltage value of the third control signal and controlling an on or off state of the detection unit according to the voltage value of the third control signal and a preset delay start voltage value.

11. The control apparatus according to claim 10, wherein the startup module includes a first switch tube, a first voltage divider, a second voltage divider, and a voltage-regulator tube, wherein both a first end of the first switch tube and a first end of the second voltage divider are electrically connected to the power input terminal, a second end of the second voltage divider is electrically connected to a first end of the voltage-regulator tube, a second end of the first switch tube is electrically connected to an electrical connection point where the second end of the second voltage divider is electrically connected to the first end of the voltage-regulator tube, a third end of the first switch tube is electrically connected with a first end of the first voltage divider, and a second end of the first voltage divider is electrically connected to a second a end of the voltage-regulator tube.

12. The control apparatus according to claim 10, wherein the switch module includes:
   a first switch unit, the first switch unit electrically connected to the power input terminal, the power output terminal, and the startup module for controlling the on or off state of the electrical connection between the power input terminal and the power output terminal;
   a first conversion unit, the first conversion unit electrically connected to the first switch unit and the detection module, wherein the first conversion unit is used to receive the first control signal input by the detection module and output a second control signal to the first switch unit according to the first control signal to control an on or off state of the first switch unit.

13. The control apparatus according to claim 12, wherein the first switch unit includes a second switch tube and a plurality of second switch tubes electrically connected in parallel, wherein the second switch tube is an N-channel metal oxide semiconductor field effect transistor.

14. The control apparatus according to claim 12, wherein the switch module includes:
   a push-pull unit electrically connected between the first switch unit and the first conversion unit for amplifying the second control signal output by the first conversion unit;
   a bias power supply module, the bias power supply module electrically connected to the switch module for supplying power to the first conversion unit and the push-pull unit.

15. The control apparatus according to claim 10, wherein the switch module includes:
   a second switch unit, the second switch unit electrically connected to the power input terminal, the power output terminal, and the startup module for controlling the on or off state of the electrical connection between the power input terminal and the power output terminal;
   a second conversion unit, the second conversion unit electrically connected to the second switch unit and the detection module, wherein the second conversion unit is used to receive a first control signal input by the detection module and output a third control signal to the second switch unit according to the first control signal to control an on or off state of the second switch unit.

16. The control apparatus according to claim 15, wherein the second switch unit includes a third switch tube and a plurality of third switch tubes electrically connected in parallel, wherein the third switch tube is a P-channel metal oxide semiconductor field effect transistor.

* * * * *